US012712017B1

(12) United States Patent
Kanj et al.

(10) Patent No.: US 12,712,017 B1

(45) Date of Patent: Aug. 18, 2026

(54) STATIC RANDOM ACCESS MEMORY CELL

(71) Applicant: Synopsys, Inc., Sunnyvale, CA (US)

(72) Inventors: Rouwaida Nawaf Kanj, Cedar Park, TX (US); John Edward Barth, Hobe Sound, FL (US)

(73) Assignee: Synopsys, Inc., Sunnyvale, CA (US)

( * ) Notice: Subject to any disclaimer, the term of this patent is extended or adjusted under 35 U.S.C. 154(b) by 108 days.

(21) Appl. No.: 18/790,335

(22) Filed: Jul. 31, 2024

(51) Int. Cl.
*G11C 11/41* (2006.01)
*G11C 11/418* (2006.01)
*G11C 11/419* (2006.01)

(52) U.S. Cl.
CPC .......... *G11C 11/419* (2013.01); *G11C 11/418* (2013.01)

(58) Field of Classification Search
CPC ............................ G11C 11/419; G11C 11/418
See application file for complete search history.

(56) References Cited

U.S. PATENT DOCUMENTS 8,971,096 B2 * 3/2015 Jung ..................... G11C 11/419 365/230.05
11,170,844 B1 * 11/2021 Doluca .................. H10B 10/12

OTHER PUBLICATIONS

Lee M., et al., "Energy- and Area-Efficient 8T SRAM Cell with FEOL CFETs and BEOL-Compatible Transistors," IEEE International Electron Devices Meeting (IEDM), 2022, pp. 350-353.

* cited by examiner

*Primary Examiner* — Xiaochun L Chen
(74) *Attorney, Agent, or Firm* — Weaver Austin Villeneuve & Sampson LLP

(57) ABSTRACT

An SRAM cell includes four PMOS and four NMOS transistors. The first PMOS and NMOS form a first inverter. The second PMOS and NMOS form a second inverter having an output coupled to an input (first node) of the first inverter, and an input coupled to an output (second node) of the first inverter. The third NMOS has its source coupled to the second node, drain coupled to a first bitline, and gate coupled to a third node. The fourth NMOS has its source coupled to the first node, drain coupled to a second bitline, and gate coupled to a fourth node. The third PMOS has its drain coupled to the first node, source coupled to the second bitline, and gate coupled to a fifth node. The fourth PMOS has its drain coupled to the second node, source coupled to the first bitline, and gate coupled to a sixth node.

20 Claims, 13 Drawing Sheets

BL/BLB
BL
BLB
W0/W0B
W0B
W0
W1/W1B
W1B
W1
$T_1$
$T_2$
$T_3$
$T_4$

| | Yield (σ) |
|---|---|
| stability | 3.6 (σ) |
| writability | 3.2 (σ) |

FIG. 12A

| | Write | Write Disturb | |
|---|---|---|---|
| criss-cross | | stab_p disturb0 | stab_p hold1 |
| 1-cycle | 3.9-4σ | 4.6σ | 4.4σ |
| 2-cycles | 4.1σ | -- | -- |

FIG. 12B

| | Read Disturb | |
|---|---|---|
| | 'criss-cross' | '2 NMOS PG disturb' |
| 1-cycle | -- | 3.8σ |
| 2-cycles | 4.3σ | -- |

FIG. 12C

STATIC RANDOM ACCESS MEMORY CELL

TECHNICAL FIELD

The present application relates to a static random access memory cell, and more particularly to a static random access memory cell controlled by four distinct wordlines that can operate in a criss-cross mode.

BACKGROUND

Semiconductor memories are widely used in electronic devices to store data. One type of semiconductor memory is a static random access memory (SRAM). An SRAM cell, in which a data bit is stored, often includes a pair of back-to-back inverters that are connected to their associated bitlines via transistor pass-gates.

As the semiconductor manufacturing technology transitions to more advanced nodes (e.g., 7 nm and below), the statistical variations inherent in the manufacturing technology, coupled with the lower supply voltages (e.g. 0.3 volts), adversely impact the functionality and yield of the SRAMs.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 12A shows the experimental yield results of the 6T SRAM cell shown in FIG. 1

FIG. 12B shows the experimental yield results of the SRAM cell shown in FIG. 4 under various write operations in accordance with one embodiment of the present disclosure.

FIG. 12C shows the experimental yield results of the SRAM cell shown in FIG. 4 under various read operations in accordance with one embodiment of the present disclosure.

DETAILED DESCRIPTION

Aspects of the present disclosure relate to an 8-transistor SRAM cell configured to be accessed using four distinct wordlines.

A 6-transistor static random-access memory (SRAM) cell is susceptible to read disturb and/or degraded writability. The read disturb may be caused as a result of the voltage increase at the internal nodes of the SRAM cell, when for example, the SRAM cell is coupled to its associated bitlines to perform a read operation. Because the bitlines are often precharged to the supply voltage during a read operation, and depending on the device process variations, a voltage divider circuit formed between a pass-gate transistor and the pulldown transistor of the SRAM cell may increase the voltage at an input of an inverter disposed in the SRAM cell to a value above the trip point of the inverter, thereby causing the data stored in the cell to change state from 1 to 0, or from 0 to 1. During write operation, it is possible that due to process variations the pass-gate transistors are weak and the cell cannot be written. Often write-assist techniques such as negative bitline boosting are invoked to enable writability.

Figure 1:
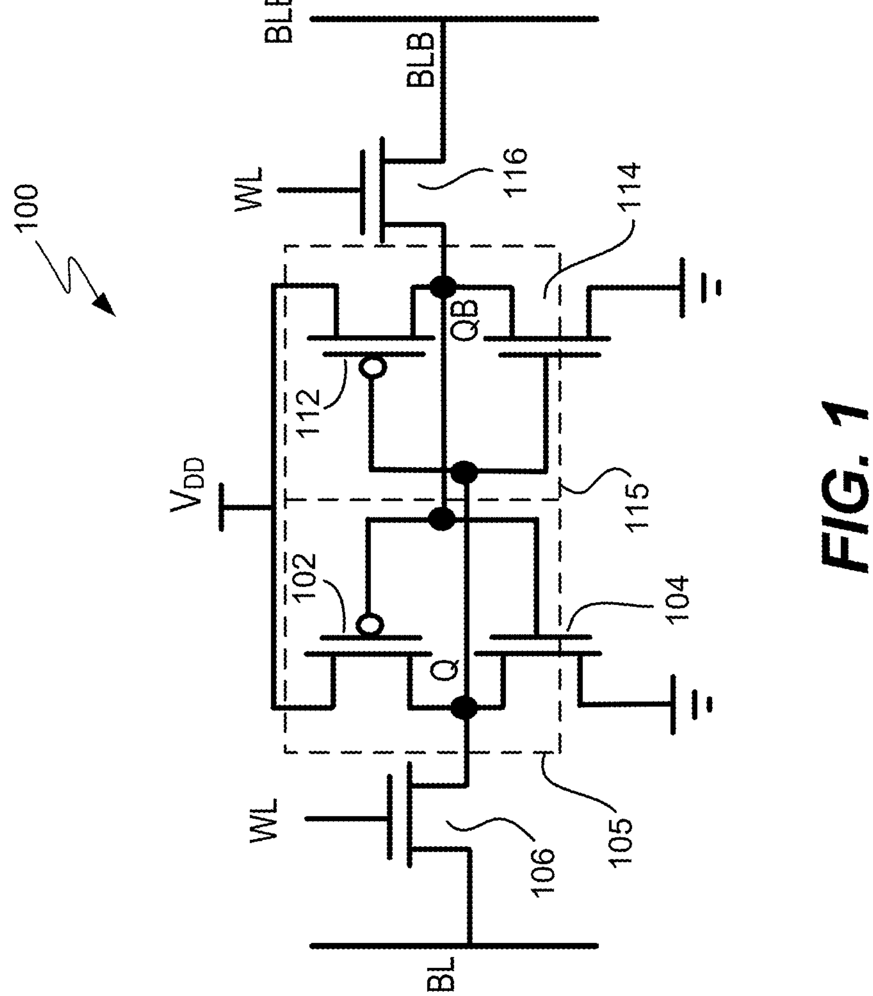
FIG. 1 is a transistor schematic diagram of a 6-transistor SRAM cell.

FIG. 1 is a transistor schematic diagram of a 6-transistor (alternatively referred to herein as 6T) SRAM cell 100. SRAM cell 100 includes, in part, p-channel metal-oxide-semiconductor (PMOS) transistor 102 and n-channel MOS transistor (NMOS) 104 forming a first inverter 105, PMOS transistor 112 and NMOS transistor 114 forming a second inverter 115, NMOS pass-gate transistor 106 coupling the output node Q of inverter 105 to biltine BL, and NMOS pass-gate transistor 116 coupling the output node QB of inverter 115 to complementary biltine BLB. The input node QB of inverter 105 is connected to the output node of inverter 115, and the input node Q of inverter 115 is connected to the output node of inverter 105.

Assume SRAM cell 100 has a logic 1 stored therein—herein considered as a logic 1 stored at node Q and a logic 0 stored at node QB. During a read operation, bitlines BL and BLB are precharged to supply voltage $V_{DD}$ and then caused to float. When wordline WL is selected (i.e., the voltage at WL increases to a level that causes NMOS transistors 106 and 116 to turn on), transistors 116 and 114 form a voltage divider, thus causing the voltage at node QB to increase. The increase in the voltage at node QB may cause inverter 105 to trip, thereby changing the data stored at node Q to a logic 0, and changing the data stored at node QB to a logic 1. In other words, during the read operation, SRAM cell 100 may flip state as a result of the read disturb.

SRAM cells are often arranged in a multitude of rows and columns to form a two dimensional array. SRAMs cells disposed along the same column may be coupled to the same bitlines, and SRAM cells disposed along the same row may be coupled to the same wordline. If an array of SRAM cells 100 is configured to be 16-bits wide, during each write operation, 16 SRAM cells at a selected row address may be accessed (activated) to store 16 bits of data. Similarly, during a read operation, 16 SRAM cells at a selected row address may be accessed to retrieve the 16 bits of data stored therein.

To perform a write operation to a group (e.g., 16 or less) of SRAM cells (herein alternatively referred to as cells), the wordline associated with the cells is activated, and the differential bitlines associated with the cells are raised to high or low voltages, representative of the data to be stored in the cells. However, because the wordlines of the selected cells are often shared with those of the other remaining cells disposed along the same row, to inhibit a write to the remaining cells, the differential bit lines associated with the remaining cells are precharged to the supply voltage $V_{DD}$ and then caused to float, referred to herein as write masking or half select mode. Therefore, the unselected row cells during a write masking experience the same voltages as during a read, and thus are susceptible to the read disturb, even during a write operation.

Figure 2:
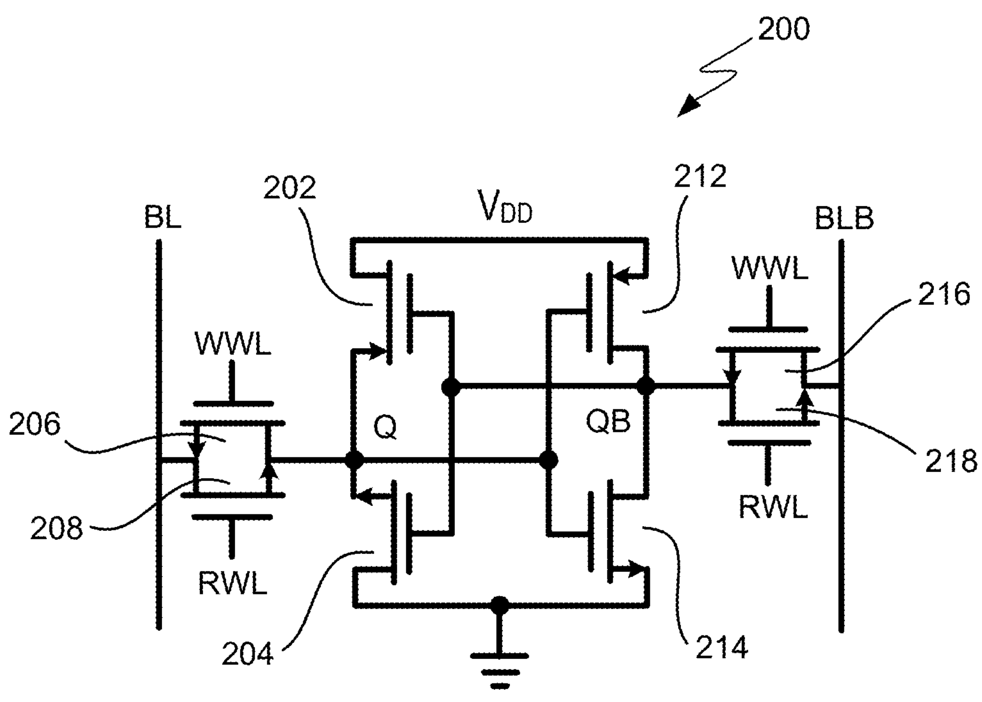
FIG. 2 is a transistor schematic diagram of an 8-transistor SRAM cell.

FIG. 2 is a transistor schematic diagram of a 8T SRAM cell 200. SRAM cell 200 is similar to SRAM cell 100 except for the following. In SRAM cell 200, node Q is coupled to bitline BL via a pair of NMOS pass-gate transistors 206, 208, and node QB is coupled to bitline BLB via a pair of NMOS pass-gate transistors 216, 218. During a write operation, signals WWL and RWL are raised to a high voltage thereby causing all four pass-gate transistors 206, 208, 216 and 218 to turn on and connect nodes Q and QB to bitlines BL and BLB, respectively. Because during a write operation, all four pass-gate transistors 206, 208, 216 and 218 are turned on, SRAM cell 200 has an improved writability relative to SRAM cell 100. During a read operation, signal RWL is raised to a high voltage thereby causing node Q to be connected to bitline BL via transistor 208, and node QB to be connected to bitline BLB via transistor 218. SRAM cell 200 is thus susceptible to the read disturb problem for the same reasons described above with respect to SRAM cell 100.

Figure 3:
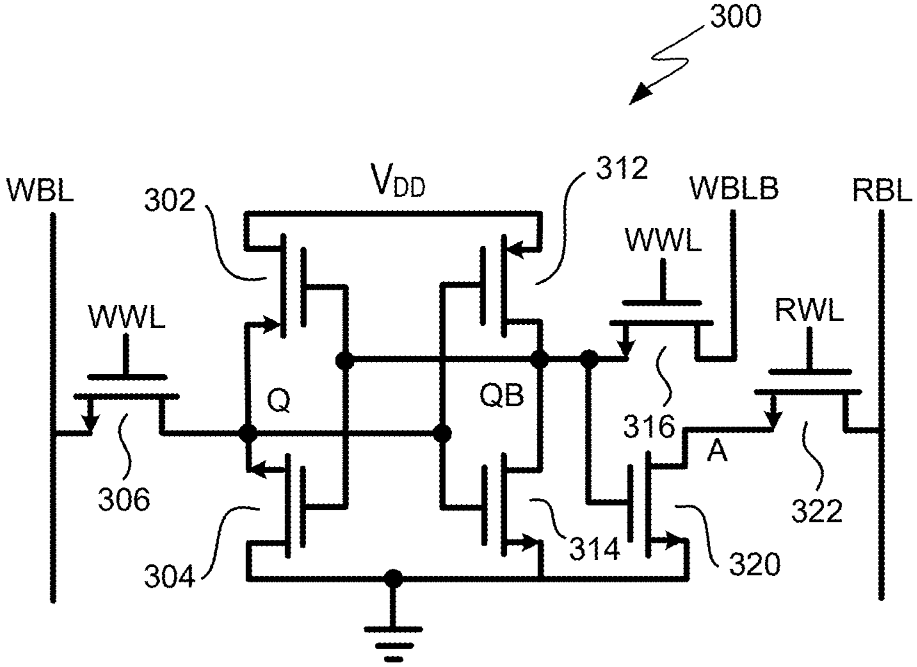
FIG. 3 is a transistor schematic diagram of an 8-transistor SRAM cell with a read bitline that is distinct from the write bitlines.

FIG. 3 is a transistor schematic diagram of another 8T SRAM cell 300. SRAM 300 has a pair of bitlines WBL and WBLB that are used during write operations, and a bitline RBL that is used during read operations. NMOS pass-gate transistors 306 and 316 couple nodes Q and QB respectively to bitlines WBL and WBLB when the SRAM cell's associated wordline WWL is selected to carry out a write operation.

During a read operation, the data at node QB is sensed at the read bitline RBL via NMOS transistors 320 and 322. Because any read disturbance at node A is inhibited from propagating to node QB by transistor 320, SRAM cell 300 is not susceptible to read disturbance. During a write operation when wordline WWL is activated but cell 300 is otherwise not the target of the write operation, transistors 306 and 316 connect nodes Q and QB to floating bitlines WBL and WBLB, respectively. Therefore, cell 300 is not immune to and thus suffers from the write mask condition.

An SRAM cell, in accordance with embodiments of the present disclosure includes, in part, four pass-gate transistors connected to four different input nodes. By controlling the timing of the voltages applied to the gate terminals of the pass-gate transistors, in one embodiment, a logic 1 maybe written to the SRAM cell using at least a PMOS pass-gate transistor which has a strong pullup capability, and a logic 0 maybe written to the SRAM cell using at least an NMOS pass-gate transistor which has a strong pulldown capability. As is described further below, among technical advantages of the present disclosure are substantially enhanced writability as well as substantially enhanced immunity to read disturb.

Figure 4:
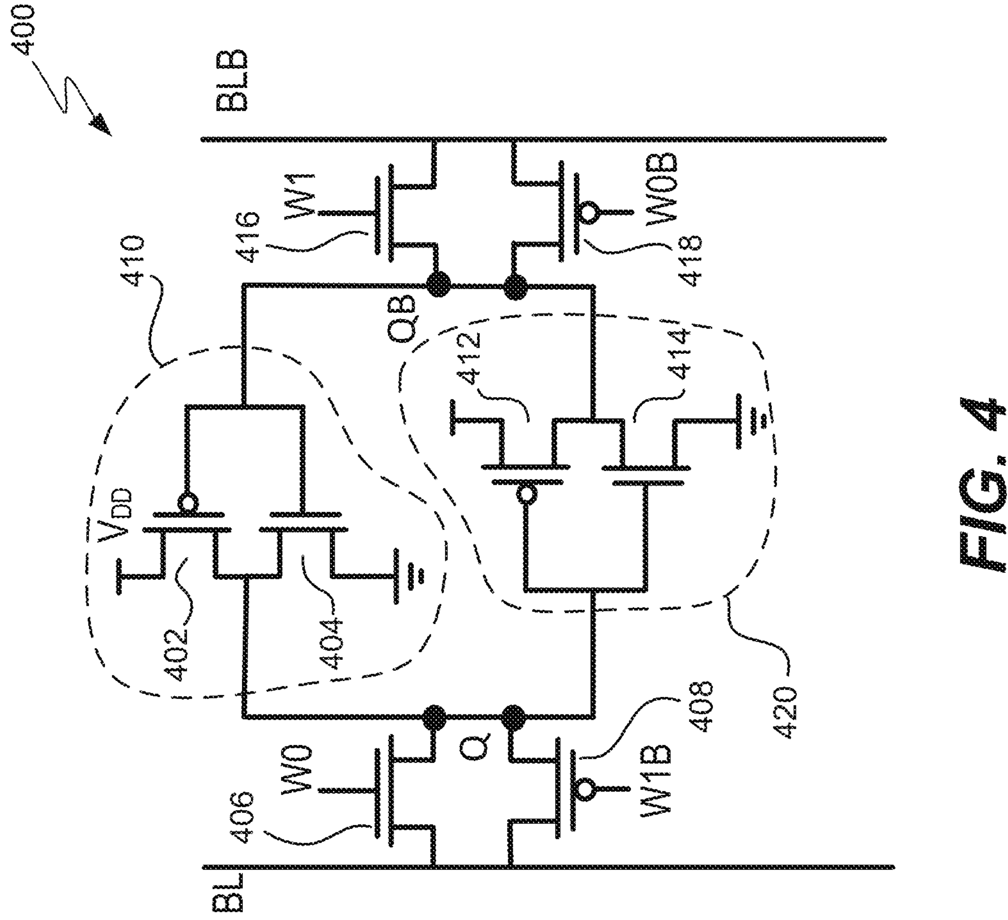
FIG. 4 is a transistor schematic diagram of an 8-transistor SRAM cell, in accordance with one embodiment of the present disclosure.

FIG. 4 is a transistor schematic diagram of an SRAM cell 400, in accordance with one embodiment of the present disclosure. SRAM cell 400 is shown as including, in part, PMOS transistor 402 and NMOS transistor 404 forming a first inverter 410, as well as PMOS transistor 412 and NMOS transistor 414 forming a second inverter 420. The input of inverter 410 is connected to the output of inverter 420 at node QB, and the input of inverter 420 is connected to the output of inverter 410 at node Q. SRAM cell 400 is also shown as including, in part, pass-gate transistors 406, 408, 416 and 418 each having a gate terminal that is coupled to a different node, as described further below.

Pass-gate transistor 406 has a source/drain terminal connected to node Q, and a drain/source terminal connected to bitline BL; the gate terminal of NMOS transistor 406 is connected to the node receiving the wordline select signal W0. PMOS pass-gate transistor 408 has a source/drain terminal connected to node Q, and a drain/source terminal connected to bitline BL; the gate terminal of PMOS transistor 408 is connected to the node receiving the wordline select signal W1B. NMOS pass-gate transistor 416 has a source/drain terminal connected to node QB, and a drain/source terminal connected to complementary bitline BLB; the gate terminal of NMOS transistor 416 is connected to the node receiving the wordline select signal W1. PMOS pass-gate transistor 418 has a source/drain terminal connected to node QB, and a drain/source terminal connected to complementary bitline BLB; the gate terminal of PMOS transistor 418 is connected to the node receiving the wordline select signal W0B. During write and read operations W0 and W0B are activated together and then W1 and W1B are activated together, or vice versa. This mode is referred to herein as criss-cross mode. Other operating write and read modes are also described herein.

In one embodiment, a write operation is completed in two cycles. During the first cycle, transistors 406 and 418 are turned on while transistors 408 and 416 are maintained off. During the second cycle, transistors 416 and 408 are turned on while transistors 406 and 418 are maintained off. In another embodiment, during the first cycle, transistors 406 and 418 are maintained off while transistors 408 and 416 are turned on, and during the second cycle transistors 416 and 408 are maintained off while transistors 406 and 418 are turned on. In the following description, it is assumed that to perform a write operation in the criss-cross mode, transistors 406 and 418 are turned on during the first cycle, and transistors 416 and 408 are turned on during the second cycle. It is understood, however, that the criss-cross write operation is symmetric with respect to first transistor pair 406/418 and the second transistor pair 408/416, and that to perform a criss-cross write operation, transistors 416 and 408 may be turned on during the first cycle, and transistors 406 and 418 may be turned on during the second cycle.

Figures 5A, 5B:
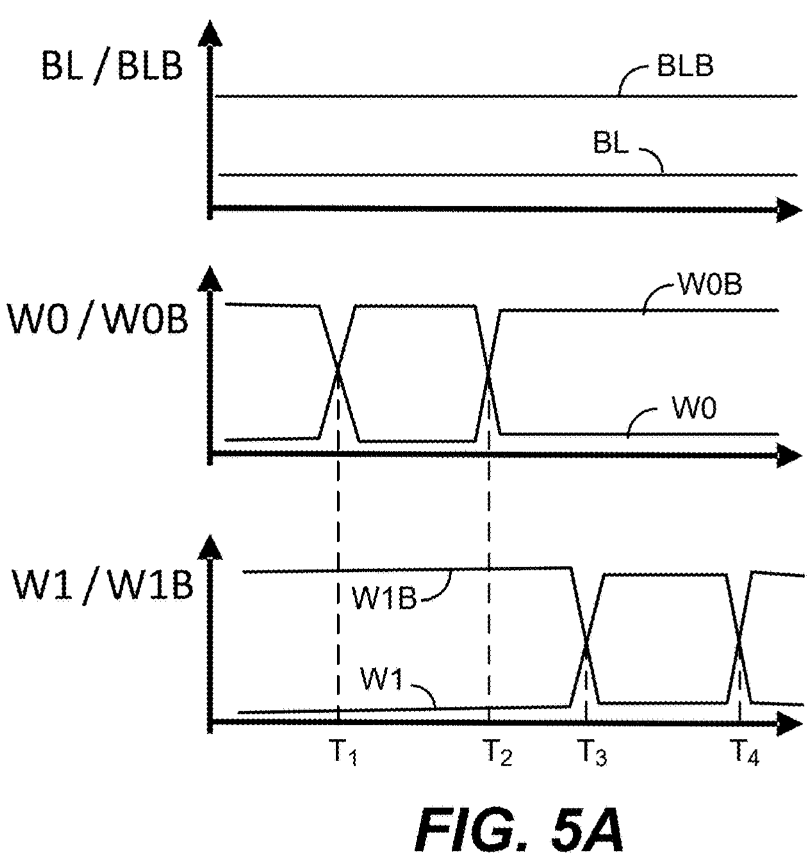
FIG. 5A shows the signal waveforms associated with the bitlines and wordlines of the SRAM cell of FIG. 4 during one example of a write operation, in accordance with one embodiment of the present disclosure.
FIG. 5B shows the signal waveforms associated with the bitlines and wordlines of the SRAM cell of FIG. 4 during one example of a write operation, in accordance with one embodiment of the present disclosure.

FIG. 5A shows the timing diagram of the signals applied to bitlines BL/BLB and the four distinct wordlines W0, W0B, W1 and W1B of SRAM cell 400 to perform a criss-cross write operation in order to store a logic 0 at node Q and a logic 1 at node QB (referred to herein as storing a logic 0 in SRAM cell 400), in accordance with one embodiment of the present disclosure. To achieve this, bitline BL is driven to a relatively low voltage (e.g., ground potential), and bitline BLB is raised to a relatively high voltage (e.g., supply voltage $V_{DD}$). Thereafter, during the first cycle ($T_2$−$T_1$) transistors 406 and 418 are turned on by applying a relatively high voltage to wordline W0 (alternatively referred to herein as selecting wordline W0), and applying a relatively low voltage to wordline W0B (alternatively referred to herein as selecting wordline W0B). Accordingly, during the first cycle, node Q receives the ground voltage of bitline BL via NMOS transistor 406, and node QB receives the supply voltage of bitline BLB via PMOS transistor 418, thereby causing a logic 0 to be stored at node Q, and a logic 1 to be stored at node QB. Because during the first cycle, node Q is pulled to the ground potential via NMOS transistor 406 (which has a relatively strong pulldown capability), the logic 0 is written strongly at node Q. Similarly, because during the first cycle, node QB is pulled to the supply voltage $V_{DD}$ via PMOS transistor 418 (which has a relatively strong pullup capability), the logic 1 is written strongly at node QB.

As shown in FIG. 5A during time period ($T_4$−$T_3$), transistor 406/418 are turned off, transistor 416 is turned on by selecting wordline W1, and transistor 408 is turned on by selecting wordline W1B. Accordingly, during the second cycle, node Q gets coupled to bitline BL via PMOS transistor 406, and node QB gets coupled to bitline BLB via NMOS transistor 416. This reinforces the write '0' operation, thereby ensuring the storage of logic 0 at node Q and logic 1 at node QB.

FIG. 5B shows the timing diagram of the signals applied to the bitlines BL/BLB and the wordlines W0, W0B, W1 and W1B of SRAM cell 400 to perform a criss-cross write operation in order to store a logic 1 in SRAM cell 400 (i.e., a logic 1 at node Q, and a logic 0 at node QB) in accordance with one embodiment of the present disclosure. To achieve this, bitline BL is driven to the supply voltage, and bitline BLB is driven to the ground potential. Thereafter, during the first cycle ($T_2$−$T_1$), transistors 406 and 418 are turned on by selecting wordlines W0 and W0B. Accordingly, during the first cycle, node Q is coupled to the supply voltage via NMOS transistor 406, and node QB is coupled to the ground voltage via PMOS transistor 418, thus causing a logic 1 to be stored at node Q, and a logic 0 to be stored at node QB.

During the second cycle, shown in FIG. 5B as time period ($T_4$−$T_3$), transistors 406/418 are turned off, transistor 416 is turned on by selecting wordline W1, and transistor 408 is turned on by selecting wordline W1B. According, during the second cycle, node Q gets coupled to bitline BL via PMOS transistor 408, and node QB gets coupled to bitline BLB via NMOS transistor 416. Because during the second cycle, node Q is pulled to the supply voltage via PMOS transistor 408 (which has a relatively strong pullup capability), the logic 1 is written strongly at node Q. Similarly, because during the second cycle, node QB is pulled to the ground potential via NMOS transistor 416 (which has a relatively strong pulldown capability), the logic 0 is written strongly at node QB. Therefore, the storage of logic 1 at node Q, and the storage of logic 0 at node QB, that statistically may not have been taken place during the first cycle due to the storage state of the SRAM cell prior to the current write operation, is properly completed during the second cycle.

Referring to FIG. 4, in some embodiments, the write operation is performed in a single cycle. For example, to store a logic 0 in SRAM cell 400, either (i) only transistors 406 and 418 are turned on during a single cycle to complete the write operation, or (ii) only transistors 408 and 416 are turned on during a single cycle to complete the write cycle. Since an NMOS transistor has a stronger pulldown capability than a PMOS transistor, and a PMOS transistor has a stronger pullup capability than an NMOS transistor, storing a logic 0 in the SRAM cell may be completed in a single cycle by turning on NMOS transistors 406—which can pull node Q to the ground potential—and concurrently turning on PMOS transistor 416 which can pull node QB to the supply voltage. Similarly, storing a logic 1 in the SRAM cell may be completed in a single cycle by concurrently turning on NMOS transistor 416 and PMOS transistor 408.

Figure 6:
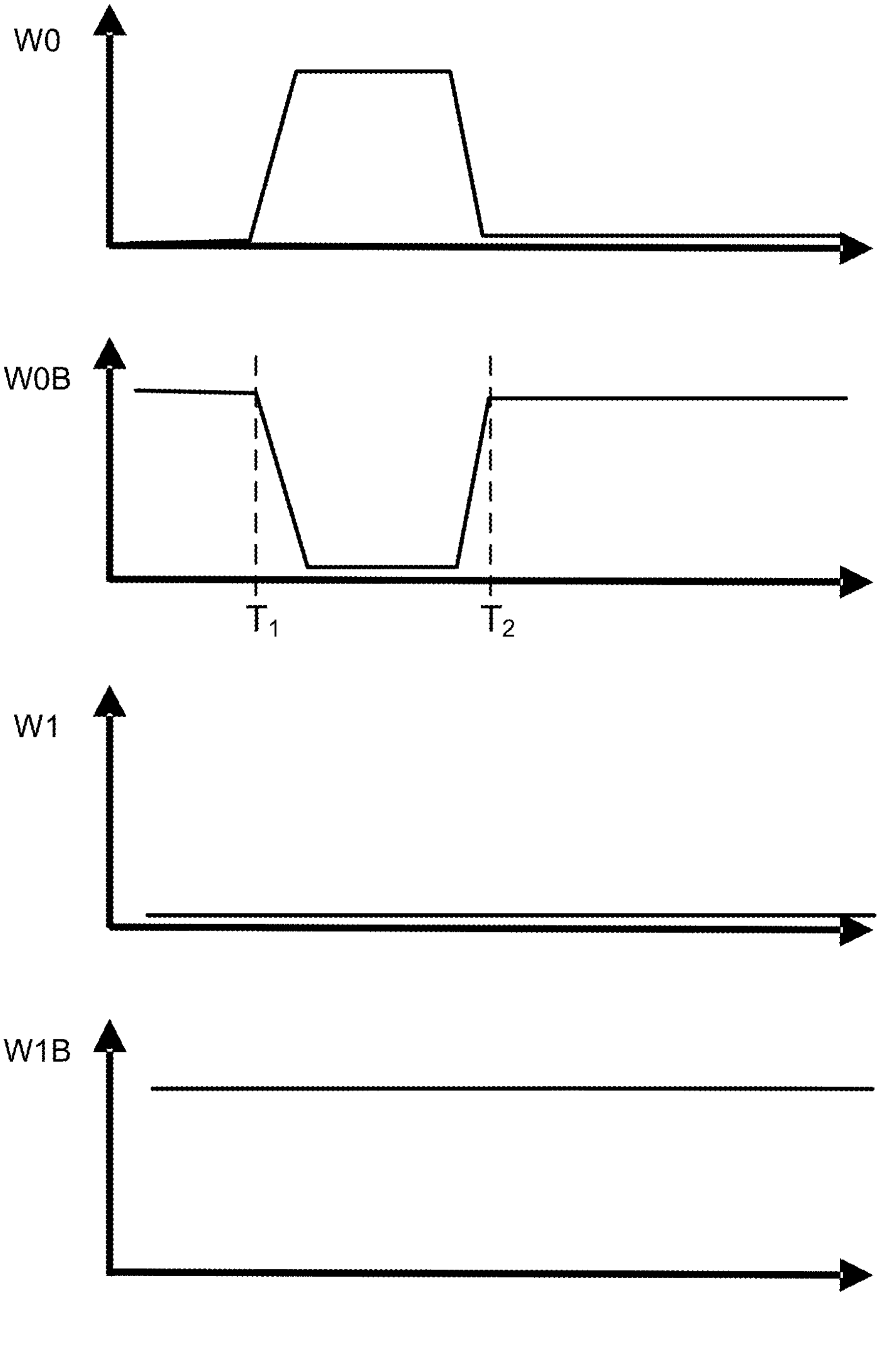
FIG. 6 shows the signal waveforms associated with the wordlines of the SRAM cell of FIG. 4 during one example of a write operation, in accordance with one embodiment of the present disclosure.

FIG. 6 shows the timing diagram of the signals applied to wordlines W0, W0B, W1 and W1B of SRAM cell 400 to perform a write operation during a single cycle in order to store a logic 0 in the SRAM cell, in accordance with one embodiment of the present disclosure. To achieve this, bitline BL is lowered to the ground potential, while bitline BLB is raised to the supply voltage $V_{DD}$ (the bitline voltages are not shown in FIG. 6). Next, during the period ($T_2$−$T_1$) the voltage at wordline W0 is increased to a high value to turn on NMOS transistor 406, and the voltage at wordline WOB is decreased to a low value to turn on PMOS transistor 418. The voltages at wordlines W1 and W1B are maintained at the ground potential and $V_{DD}$ respectively, to keep transistors 416 and 408 off during such a write operation. Accordingly, node Q receives the ground potential via NMOS pulldown transistor 406, while concurrently node QB receives the supply voltage $V_{DD}$ via PMOS pullup transistor 418, thereby causing the SRAM cell to store a logic 0.

Figure 7:
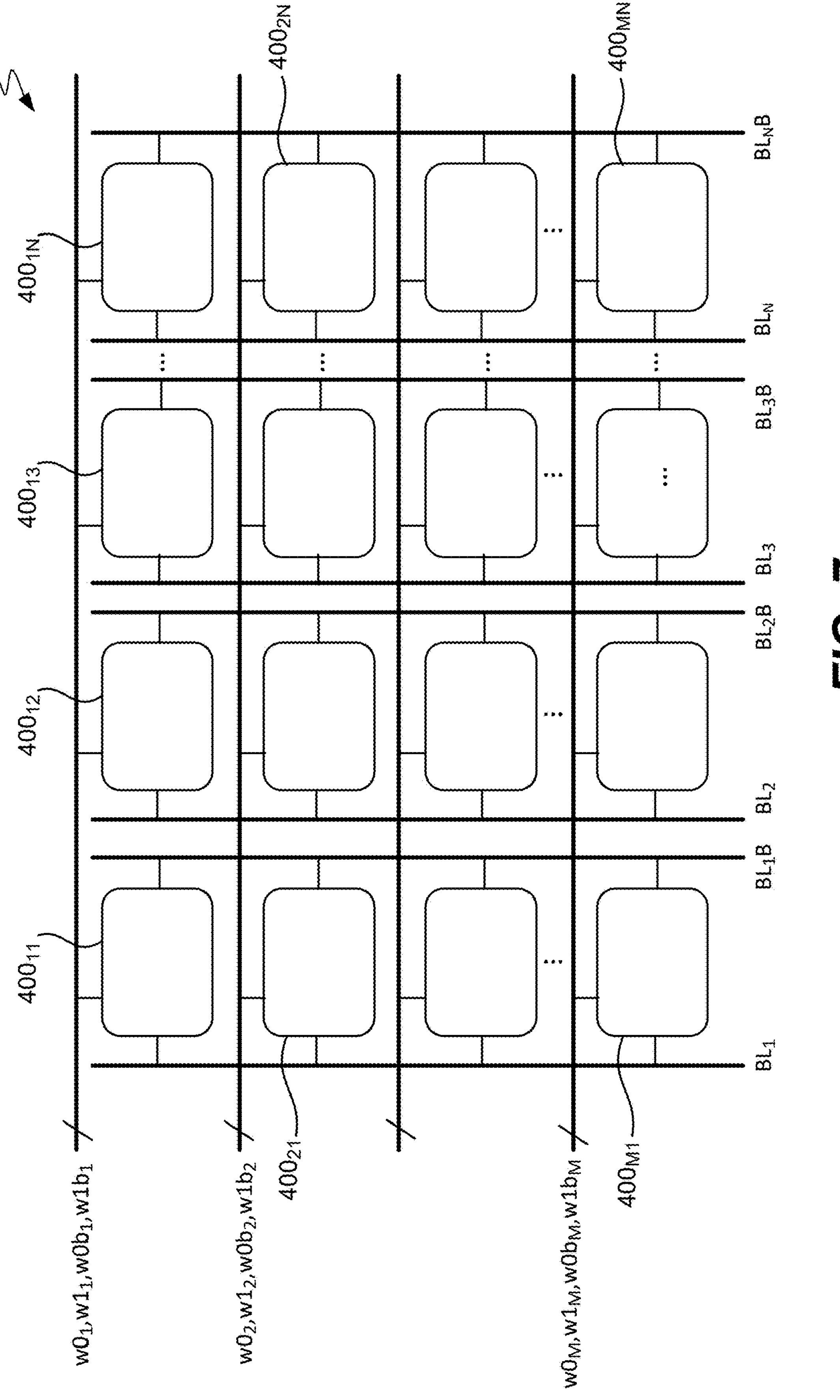
FIG. 7 shows an array of SRAM cells of FIG. 4 arranged along a multitude of rows and columns, in accordance with one embodiment of the present disclosure.

FIG. 7 shows an exemplary array 700 of M×N SRAM cell groups $\mathbf{400}_{ij}$ arranged along M rows and N columns, where M and N are integers greater than 1, where i—which ranges from 1 to M—refers to the row number in which an SRAM cell group 400 is disposed; and j—which ranges from 1 to N—refers to the column number in which an SRAM cell group 400 is disposed. Each SRAM cell group may include multiple SRAM cells 400. For example, each cell group may have 8, 16 or 32 SRAM cells. In the following description, for simplicity, it is assumed that each cell group includes a single SRAM cell 400.

As shown, all SRAM cells disposed in the same column share the same bit lines BLj/$BL_j$B, and all SRAM cells disposed in the same row share the same wordlines $W0_i$/$W1_i$/$W0B_i$/$W1B_i$. For example SRAM cells $\mathbf{400}_{11}$, $\mathbf{400}_{21}$ . . . $\mathbf{400}_{M1}$ disposed in the first column share the same bitlines $BL_1$/$BL_1$B. Similarly, SRAM cells $\mathbf{400}_{11}$, $\mathbf{400}_{12}$ . . . $\mathbf{400}_{1M}$ disposed in the first row share the same wordlines $W0_1$/$W1_1$/$W0B_1$/$W1B_1$.

Assume SRAM cells $\mathbf{400}_{11}$ and $\mathbf{400}_{13}$ in row 1 are selected for a write operation during which a logic 0 is to be stored in cells $\mathbf{400}_{11}$ and $\mathbf{400}_{13}$ (i.e., at nodes Q of cells $\mathbf{400}_{11}$ and $\mathbf{400}_{13}$) in a single cycle. To achieve this, the voltages at bitlines $BL_1$ and $BL_3$ are lowered to the ground potential, and the voltages at bitlines $BL_1$B and $BL_3$B are increased to the supply voltage. Because unselected SRAM cells $\mathbf{400}_{12}$, $400_{14}$ . . . $400_{1N}$ are disposed in the same row as SRAM cells $400_{11}$ and $400_{13}$, the wordlines of SRAM cells $400_{12}$, $400_{14}$ . . . $400_{1N}$ are also activated during the write operation. To enable write masking in order to inhibit writing in the unselected cells $400_{12}$, $400_{14}$ . . . $400_{1N}$, the bitlines associated with the unselected cells are precharged to the supply voltage $V_{DD}$ and then caused to float.

Figure 8B:
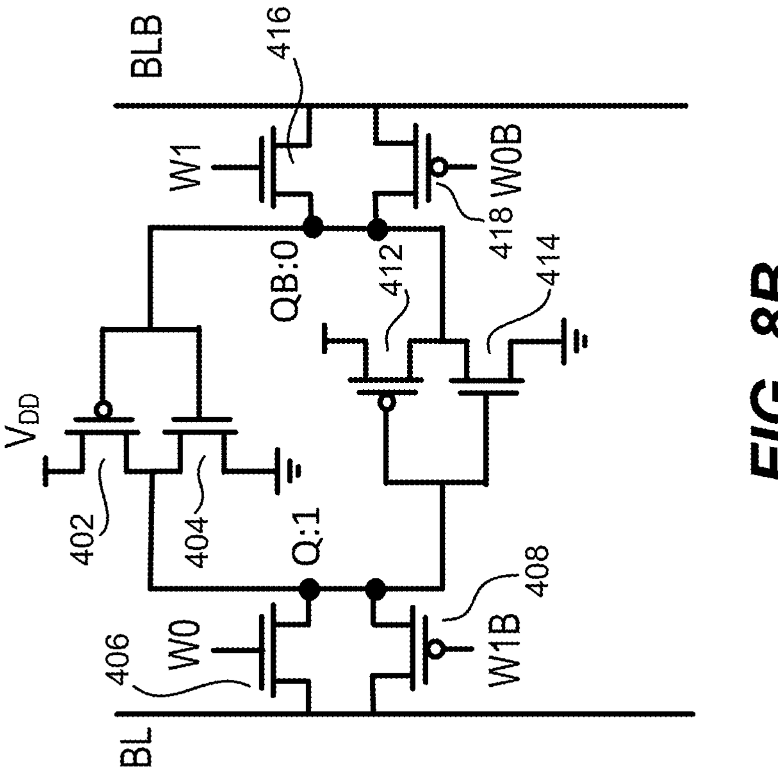
FIG. 8B shows the SRAM cell of FIG. 4 when the SRAM cell has a logic 1 stored therein.
Figure 8A:
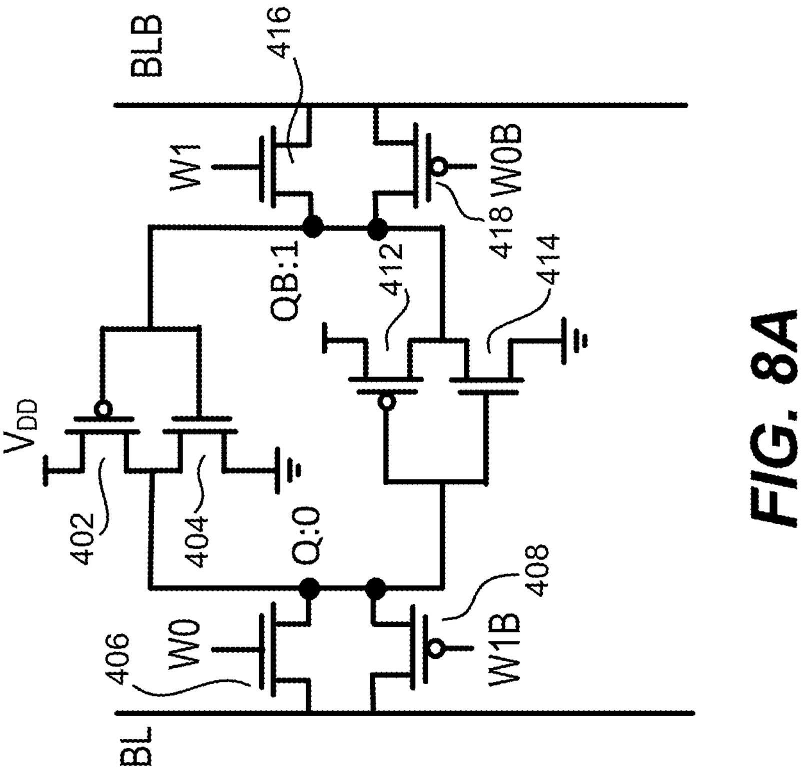
FIG. 8A shows the SRAM cell of FIG. 4 when the SRAM cell has a logic 0 stored therein.

FIG. 8A is a schematic diagram of an unselected cell, e.g., $400_{12}$ of FIG. 7, assuming cell $400_{12}$ has previously stored therein a logic 0 (i.e., node Q of the cell is at logic 0 and node QB is at logic 1). During the period when transistors 408 and 416 are turned on to carry out the write operation on the selected cells disposed in the same row, a conductive path is formed between bitline BL and node Q via PMOS transistor 408 which may disturb the cell. However, because a PMOS transistor, such as PMOS transistor 408, is often relatively weak compared to an NMOS transistor and hence has a higher resistance, coupled with the fact that NMOS transistor 416 is also turned on to further hold node QB at a logic 1, the read disturb at cell $400_{12}$ node Q via PMOS transistor 408 is substantially mitigated; such read disturb or stability is alternatively referred to herein as "stab_Pdisturb0".

FIG. 8B is a schematic diagram of an unselected cell, e.g., $400_{1N}$ of FIG. 7, assuming cell $400_{1N}$ has previously stored therein a logic 1. During the period when transistors 408 and 416 are turned on to carry out the write operation on the selected cells disposed in the same row, a conductive path is formed between bitline BLB and node QB (which is held at logic 0 due to the previous write operation) via NMOS transistor 416 which may disturb the cell. However, due to the fact that PMOS transistor 408 is also turned on to further hold node Q at logic 1, statistically the read disturb at cell $400_{1N}$ via NMOS transistor 416 ability to flip the cell content is substantially mitigated due to the PMOS holding the 1 compared to the 6T scenario; such read disturb or stability is alternatively referred to herein as "stab_Phold1".

Figure 9:
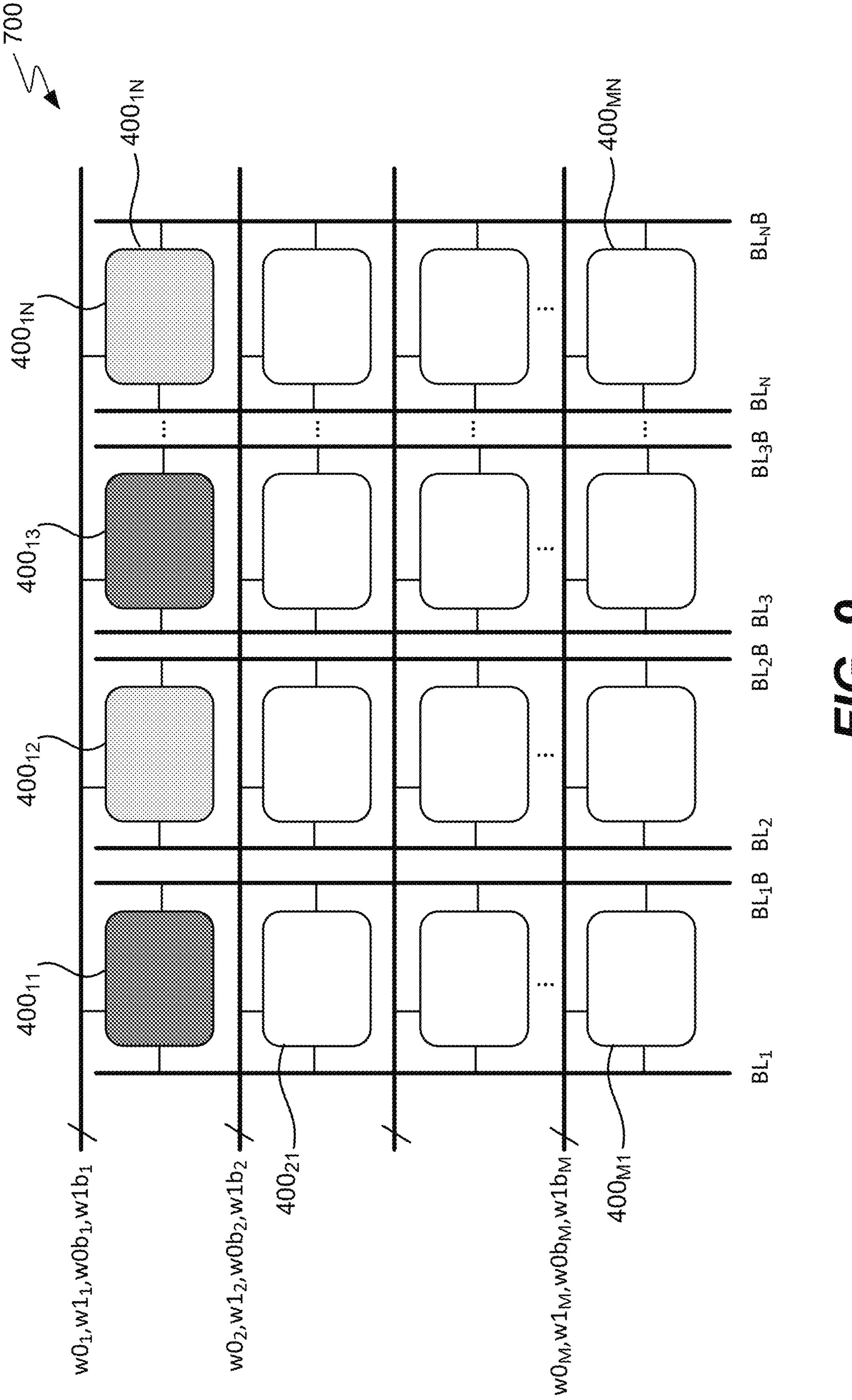
FIG. 9 shows an array of SRAM cells of FIG. 4 arranged along a multitude of rows and columns, highlighting cells that share common wordlines, in accordance with one embodiment of the present disclosure.

FIG. 9 shows array 700 of M×N SRAM cells $400_{ij}$ also shown in FIG. 7. Assume SRAM cells $400_{11}$, $400_{12}$, $400_{13}$, and $400_{1N}$ disposed in row 1 are selected for a 2 cycle write operation during which a logic 0 is to be stored in cells $400_{11}$ and $400_{13}$ (i.e., at node Q of cells $400_{11}$ and $400_{13}$), and a logic 1 is to be stored in cells $400_{12}$ and $400_{1N}$. To achieve this, the voltages at bitlines $BL_1$, $BL_2B$, $BL_3$ and $BL_NB$ are lowered to the ground potential, and the voltages at bitlines $BL_1B$, BL2, $BL_3B$ and $BL_N$ are increased to the supply voltage.

Referring to FIGS. 4 and 9 concurrently, to perform the write operation, during the first cycle, transistors 406 and 418 of cells $400_{11}$, $400_{12}$, $400_{13}$, and $400_{1N}$ are turned on, and transistors 408 and 416 of cells $400_{11}$, $400_{12}$, $400_{13}$, and $400_{1N}$ are turned off. Therefore, a logic 0 is stored relatively strongly in cells $400_{11}$ and $400_{13}$ via their associated NMOS transistors 406 and PMOS transistors 418. During the first cycle, a logic 1 is also stored in cells $400_{12}$ and $400_{1N}$ via their associated NMOS transistors 406 and PMOS transistors 418. However, because the pullup capability of an NMOS transistor is not as strong as the pullup capability of a PMOS transistor, and further because the pulldown capability of a PMOS transistor is not as strong as the pulldown capability of an NMOS transistor, the storage of logic 1 in cells $400_{12}$ and $400_{1N}$ may not occur as strongly as the storage of logic 0 in cells $400_{11}$ and $400_{13}$ due to statistical variations during the first cycle.

During the second cycle, transistors 408 and 416 of cells $400_{11}$, $400_{12}$, $400_{13}$, and $400_{1N}$ are turned on, and transistors

406 and 418 of cells $400_{11}$, $400_{12}$, $400_{13}$, and $400_{1N}$ are turned off. This causes the storage of logic 0 in cells $400_{11}$ and $400_{13}$ to be reinforced.

During the second cycle, PMOS transistor 408 of cells $400_{12}$ and $400_{1N}$ couple node Q of the cells to the supply voltage (i.e., the voltage of bitlines $BL_2$ and $BL_N$), and NMOS transistor 416 of cells $400_{12}$ and $400_{1N}$ couple node QB of the cells to the ground voltage (i.e., the voltage of bitlines $BL_2B$ and $BL_NB$), thereby strongly reinforcing the storage of logic 1 in cells $400_{11}$ and $400_{13}$. In other words, during the first cycle of the write operation a logic 0 is strongly written to cells $400_{11}$ and $400_{13}$, and during the second cycle of the write operation a logic 1 is strongly written to cells $400_{12}$ and $400_{1N}$.

To perform a read operation of a selected SRAM cell, in accordance with embodiments of the present disclosure, the bitlines associated with the selected cell are first precharged to the supply voltage and then caused to float. Thereafter, in one embodiment, the wordlines of the cell are activated during two cycles to couple the cell to the cell's associated bitlines to enable the data stored in the cell to cause changes in the voltages of the floating bitlines. The bitlines' voltages are then sensed by a sense amplifier (not shown) to detect the stored data.

Figures 10A, 10B:
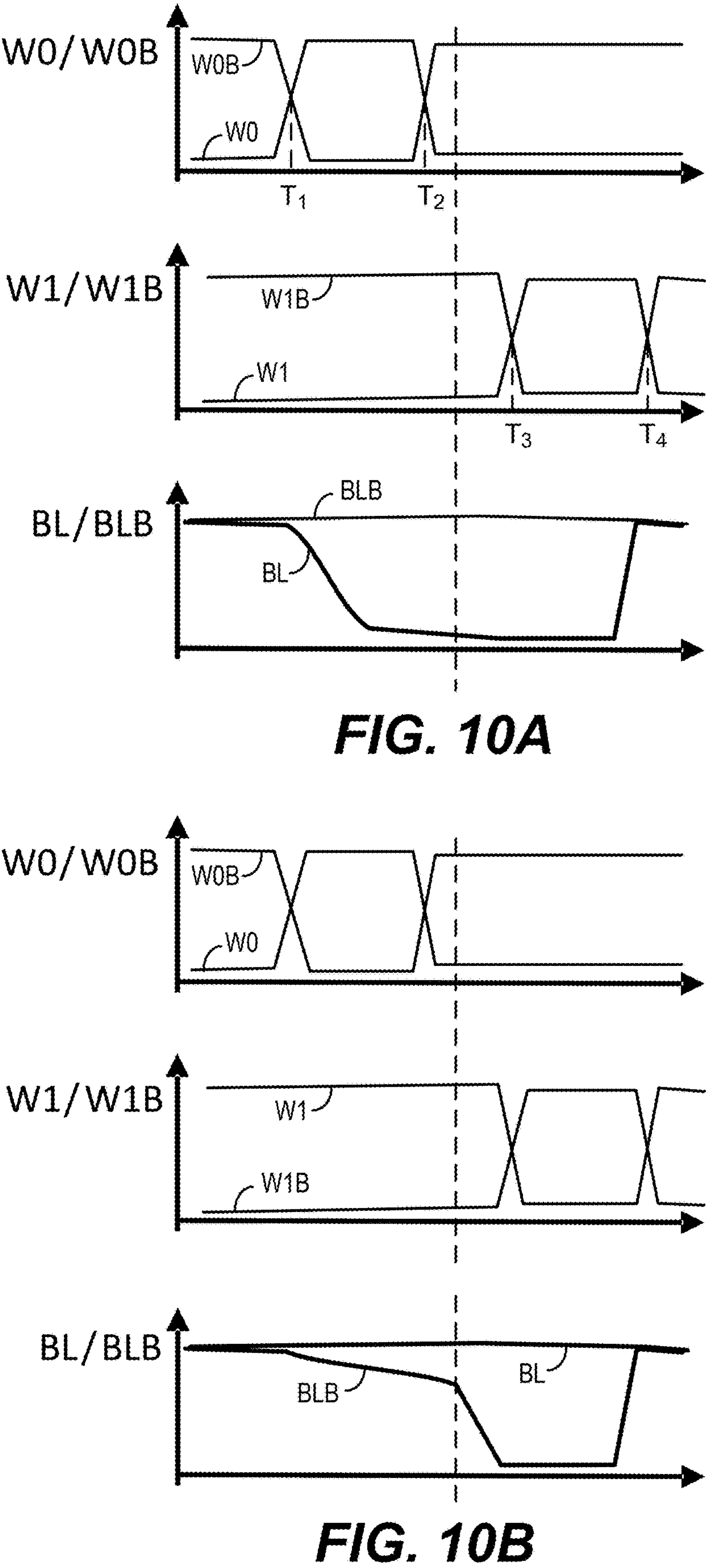
FIG. 10A shows the signal waveforms associated with the bitlines and wordlines of the SRAM cell of FIG. 4 during one example of a read operation developing a majority of signal during a first time period, in accordance with one embodiment of the present disclosure.
FIG. 10B shows the signal waveforms associated with the bitlines and wordlines of the SRAM cell of FIG. 4 during one example of a read operation developing a majority of signal during a second time period, in accordance with one embodiment of the present disclosure.

FIG. 10A is an example of the timing diagram of the voltages applied to the wordlines of SRAM cell 400 shown in FIG. 4 to perform a read operation. In FIG. 10A, it is assumed that the SRAM cell has a logic 0 stored therein. During the first cycle defined by the period ($T_2$-$T_1$), wordlines W0 and W0B are shown as being selected thus causing nodes Q and QB of the SRAM cell to be coupled to bitlines BL and BLB via NMOS transistor 406 and PMOS transistor 418 respectively. This causes bitline BL to be pulled to a low voltage via NMOS transistors 406 and 404, and bitline BLB to remain at a high voltage via PMOS transistors 418 and 412, as shown in FIG. 10A; with lower risk of disturb as previously described. During the second cycle defined by the period ($T_4$-$T_3$), wordlines W1 and W1B are selected thus causing the reinforcement of the bitline voltage drop—that occurred during the first cycle—through NMOS transistor 416 and PMOS transistor 408. The difference between the voltages of bitlines BL and BLB is subsequently sensed by a sense amplifier (not shown) to detect the logic 0 stored in the cell.

FIG. 10B is another example of the timing diagram of the voltages applied to the wordlines of SRAM cell 400 shown in FIG. 4 to perform a read operation. In FIG. 10B, it is assumed that the SRAM cell has a logic 1 stored therein. During the first cycle defined by the period ($T_2$-$T_1$), wordlines W0 and W0B are shown as being selected thus causing nodes Q and QB of the SRAM cell to be coupled to bitlines BL and BLB via NMOS transistor 406 and PMOS transistor 418 respectively. This causes bitline BLB to be weakly pulled to a low voltage via NMOS transistor 414 and PMOS transistor 418, and bitline BL to remain at a high voltage via NMOS transistor 406 and PMOS transistor 402, as shown in FIG. 10B. During the second cycle defined by the period ($T_4$-$T_3$), wordlines W1 and W1B are selected thus causing the reinforcement of the bitline voltages—that occurred during the first cycle—through NMOS transistor 416 and PMOS transistor 408, the voltage at node BLB is weakly pulled to the ground potential because PMOS transistors do not pull strongly to ground. Because during the second cycle, the voltage at node BLB is strongly coupled to the ground potential via NMOS transistors 416 and 414, the voltage at node BLB is more strongly pulled to the ground potential. The difference between the voltages of bitlines BL and BLB is subsequently sensed by a sense amplifier (not shown) to detect the logic 1 stored in the cell. In some embodiments of the present disclosure, the read operation is performed using a single cycle, during which, for example, only transistors 406 and 416 are turned to couple nodes Q and QB to the floating bitlines BL and BLB to sense the data stored in the SRAM cell thereby invoking two NMOS PGs for the read similar to 6T designs.

Figure 11:
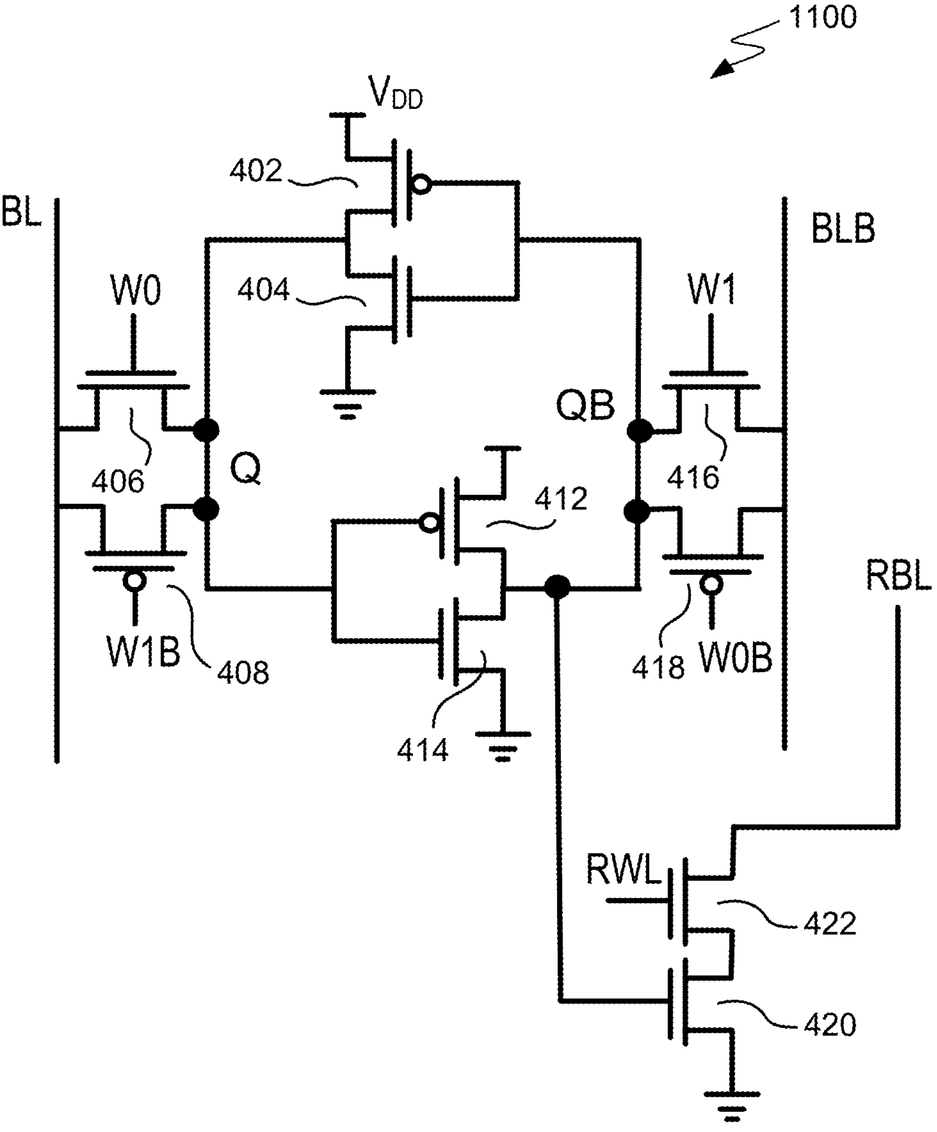
FIG. 11 is a transistor schematic diagram of a 10-transistor SRAM cell, in accordance with another embodiment of the present disclosure.

FIG. 11 is a transistor schematic diagram of an SRAM cell 1100, in accordance with another embodiment of the present disclosure. SRAM cell 1100 is similar to SRAM cell 400 shown in FIG. 4, except that SRAM cell 1100 further includes NMOS transistors 420 and 422. Moreover, in SRAM cell 1100, the pair of bitlines BL and BLB are used during write operations, and bitline RBL is used during read operations.

As is shown, the gate terminal of transistor 420 is coupled to node QB, and the source terminal of transistor 420 is coupled to a ground terminal. The drain terminal of transistor 420 is coupled to the source terminal of transistor 422 whose drain terminal is coupled to the read bitline RBL. The gate terminal of transistor 422 is coupled to the read wordline RWL 422. The write operation of SRAM cell 1100 is similar to that of SRAM cell 400 described in detail above. During a read operation, however, the voltage at read wordline RWL is raised to a high value thus causing transistor 422 to turn on. If the stored voltage at node QB is high, transistor 420 also turns on thus causing the voltage of read bitline RBL to be pulled to ground via transistors 420 and 422. If the voltage at node QB is low, transistor 420 remains off thus causing the voltage at read biltine RBL to remain relatively high. SRAM 1100 therefore uses a single-ended read operation scheme.

FIG. 12A shows the experimental yield results of 6-transistors SRAM cell 100 shown in FIG. 1 when the supply voltage is 0.3 volts and the SRAM cell is manufactured using a 7 nm semiconductor processing technology. As the Table of FIG. 12A shows, the yield associated with the SRAM cells passing the read stability (disturbance) is 3.6σ, and the yield associated with the cells passing writability is 3.2σ.

FIG. 12B shows the experimental yield results of SRAM cell 400 shown in FIG. 4 under various write operations when the supply voltage is 0.3 volts and the SRAM is manufactured using a 7 nm semiconductor processing technology. When the write operation is performed using a single cycle (1-cycle), the yield associated with the cells passing the writability test is 3.9σ-4.0σ. The yield associated with the stability conditions "stab_Pdisturb0" and "stab-_Phold1" defined above are respectively 4.6σ and 4.4σ for a single cycle write operation. When the write operation is performed using two cycles, the yield associated with the cells passing the writability test is 4.1σ. As described above, SRAM cell 400 may not be susceptible to the stability conditions "stab_pdisturb0" and "stab_phold1" when the write operation is carried out in two cycles if all the cells are being written since 0s and 1s can be written at once.

FIG. 12C shows the experimental yield results of SRAM cell 400 shown in FIG. 4 under various read operations when the supply voltage is 0.3 volts and the SRAM is manufactured using a 7 nm fabrication technology. When the read operation is performed using a single cycle, the yield associated with the stability conditions caused by the two NMOS pass gates 406 and 416 is 3.8σ. When the read operation is performed using two cycles criss-cross mode, the yield associated with the cells subject to read disturbance test is 4.3σ.

A static random access memory (SRAM) cell, in accordance with one embodiment of the present disclosure, includes, in part, first, second, third and fourth PMOS transistors, and first, second, third and fourth NMOS transistors. The first PMOS transistor has a source terminal coupled to a supply voltage and a gate terminal coupled to a first node. The first NMOS transistor has a source terminal receiving a ground voltage, a gate terminal coupled to the first node, and a drain terminal coupled to the drain terminal of the first PMOS transistor. The second PMOS transistor has a source terminal coupled to the supply voltage and a gate terminal coupled to a second node. The second NMOS transistor has a source terminal receiving the ground voltage, a gate terminal coupled to the second node, and a drain terminal coupled to the drain terminal of the second PMOS transistor and the first node, wherein the drain terminals of the first PMOS and first NMOS transistors are coupled to the second node. The third NMOS transistor has a source/drain terminal coupled to the second node, a drain/source terminal coupled to a first bitline, and a gate terminal coupled to a third node. The fourth NMOS transistor has a source/drain terminal coupled to the first node, a drain/source terminal coupled to a second bitline, and a gate terminal coupled to a fourth node. The third PMOS transistor has a drain/source terminal coupled to the first node, a source/drain terminal coupled to the second bitline, and a gate terminal coupled to a fifth node. The fourth PMOS transistor has a drain/source terminal coupled to the second node, a source/drain terminal coupled to the first bitline, and a gate terminal coupled to a sixth node.

In one embodiment, to perform a write operation to the SRAM cell, during a first time period, the third PMOS transistor and the third NMOS transistor are turned on, and the fourth PMOS transistor and the fourth NMOS transistor are turned off. In one embodiment, to perform a write operation to the SRAM cell, during a second time period, the fourth PMOS transistor and the fourth NMOS transistor are turned on, and the third PMOS transistors and the third NMOS transistor are turned off.

In one embodiment, to perform a read operation of the SRAM cell, during a third time period, the third PMOS transistor and the third NMOS transistor are turned on, and the fourth PMOS transistor and the fourth NMOS transistor are turned off. In one embodiment, to perform a read operation of the SRAM cell, during a fourth time period, the fourth PMOS transistor and the fourth NMOS transistor are turned on, and the third PMOS transistor and the third NMOS transistor are turned off. In one embodiment, to perform a read operation of the SRAM cell, during a time period, the third NMOS transistor and the fourth NMOS transistor are turned on.

In one embodiment, the SRAM cell further includes, in part, a fifth NMOS transistor having a gate terminal coupled to the first node, and a source terminal receiving the ground voltage; and a sixth NMOS transistor having a gate terminal coupled to a seventh node, a source terminal coupled to a drain terminal of the fifth NMOS transistor, and a drain terminal coupled to a third bitline. In one embodiment, during a write operation to the SRAM cell, the first bitline is coupled to the second node and the second bitline is coupled to the first node, and during a read operation the first node is coupled to the third bitline.

A system, in accordance with one embodiment of the present disclosure, includes, in part, a memory storing instructions; and a processor, coupled with the memory and configured to execute the instructions. The instructions when executed cause the processor to generate data representative of first, second, third and fourth PMOS transistors, and first, second, third and fourth NMOS transistors. The first PMOS transistor has a source terminal coupled to a supply voltage and a gate terminal coupled to a first node. The first NMOS transistor has a source terminal receiving a ground voltage, a gate terminal coupled to the first node, and a drain terminal coupled to the drain terminal of the first PMOS transistor. The second PMOS transistor has a source terminal coupled to the supply voltage and a gate terminal coupled to a second node. The second NMOS transistor has a source terminal receiving the ground voltage, a gate terminal coupled to the second node, and a drain terminal coupled to the drain terminal of the second PMOS transistor and the first node, wherein the drain terminals of the first PMOS and first NMOS transistors are coupled to the second node. The third NMOS transistor has a source/drain terminal coupled to the second node, a drain/source terminal coupled to a first bitline, and a gate terminal coupled to a third node. The fourth NMOS transistor has a source/drain terminal coupled to the first node, a drain/source terminal coupled to a second bitline, and a gate terminal coupled to a fourth node. The third PMOS transistor has a drain/source terminal coupled to the first node, a source/drain terminal coupled to the second bitline, and a gate terminal coupled to a fifth node. The fourth PMOS transistor has a drain/source terminal coupled to the second node, a source/drain terminal coupled to the first bitline, and a gate terminal coupled to a sixth node.

In one embodiment of the system, to perform a write operation to the SRAM cell, during a first time period, the third PMOS transistor and the third NMOS transistor are turned on, and the fourth PMOS transistor and the fourth NMOS transistor are turned off. In one embodiment of the system, to perform a write operation to the SRAM cell, during a second time period, the fourth PMOS transistor and the fourth NMOS transistor are turned on, and the third PMOS transistor and the third NMOS transistor are turned off.

In one embodiment of the system, to perform a read operation of the SRAM cell, during a third time period, the third PMOS transistor and the third NMOS transistor are turned on, and the fourth PMOS transistor and the fourth NMOS transistor are turned off. In one embodiment of the system, to perform a red operation of the SRAM cell, during a fourth time period, the fourth PMOS transistor and the fourth NMOS transistor are turned on, and the third PMOS transistor and the third NMOS transistor are turned off.

In one embodiment, the instructions further cause the processor to generate data representative of a fifth NMOS transistor having a gate terminal coupled to the first node, and a source terminal receiving the ground voltage; and generate data representative of a sixth NMOS transistor having a gate terminal coupled to a seventh node, a source terminal coupled to a drain terminal of the fifth NMOS transistor, and a drain terminal coupled to a third bitline.

A non-transitory computer readable medium, in accordance with one embodiment of the present disclosure, includes, in part, stored instructions, which when executed by a processor, cause the processor to generate data representative of first, second, third and fourth PMOS transistors, and first, second, third and fourth NMOS transistors. The first PMOS transistor has a source terminal coupled to a supply voltage and a gate terminal coupled to a first node. The first NMOS transistor has a source terminal receiving a ground voltage, a gate terminal coupled to the first node, and a drain terminal coupled to the drain terminal of the first PMOS transistor. The second PMOS transistor has a source terminal coupled to the supply voltage and a gate terminal coupled to a second node. The second NMOS transistor has a source terminal receiving the ground voltage, a gate terminal coupled to the second node, and a drain terminal coupled to the drain terminal of the second PMOS transistor and the first node, wherein the drain terminals of the first PMOS and first NMOS transistors are coupled to the second node. The third NMOS transistor has a source/drain terminal coupled to the second node, a drain/source terminal coupled to a first bitline, and a gate terminal coupled to a third node. The fourth NMOS transistor has a source/drain terminal coupled to the first node, a drain/source terminal coupled to a second bitline, and a gate terminal coupled to a fourth node. The third PMOS transistor has a drain/source terminal coupled to the first node, a source/drain terminal coupled to the second bitline, and a gate terminal coupled to a fifth node. The fourth PMOS transistor has a drain/source terminal coupled to the second node, a source/drain terminal coupled to the first bitline, and a gate terminal coupled to a sixth node.

In one embodiment of the non-transitory computer readable medium, to perform a write operation to the SRAM cell, during a first time period, the third PMOS transistor and the third NMOS transistor are turned on, and the fourth PMOS transistor and the fourth NMOS transistor are turned off. In one embodiment of the non-transitory computer readable medium, to perform the write operation to the SRAM cell, during a second time period, the fourth PMOS transistor and the fourth NMOS transistor are turned on, and the third PMOS transistor and the third NMOS transistors are turned off.

In one embodiment of the non-transitory computer readable medium, to perform a read operation of the SRAM cell, during a third time period, the third PMOS transistor and the third NMOS transistor are turned on, and the fourth PMOS transistor and the fourth NMOS transistor are turned off. In one embodiment of the non-transitory computer readable medium, to perform a read operation of the SRAM cell, during a fourth time period, the fourth PMOS transistor and the fourth NMOS transistor are turned on, and the third PMOS transistor and the third NMOS transistor are turned off.

In one embodiment of the non-transitory computer readable medium, the instructions further cause the processor to generate data representative of a fifth NMOS transistor having a gate terminal coupled to the first node, and a source terminal receiving the ground voltage; and generate data representative of a sixth NMOS transistor having a gate terminal coupled to a seventh node, a source terminal coupled to a drain terminal of the sixth NMOS transistor, and a drain terminal coupled to a third bitline.

Figure 13:
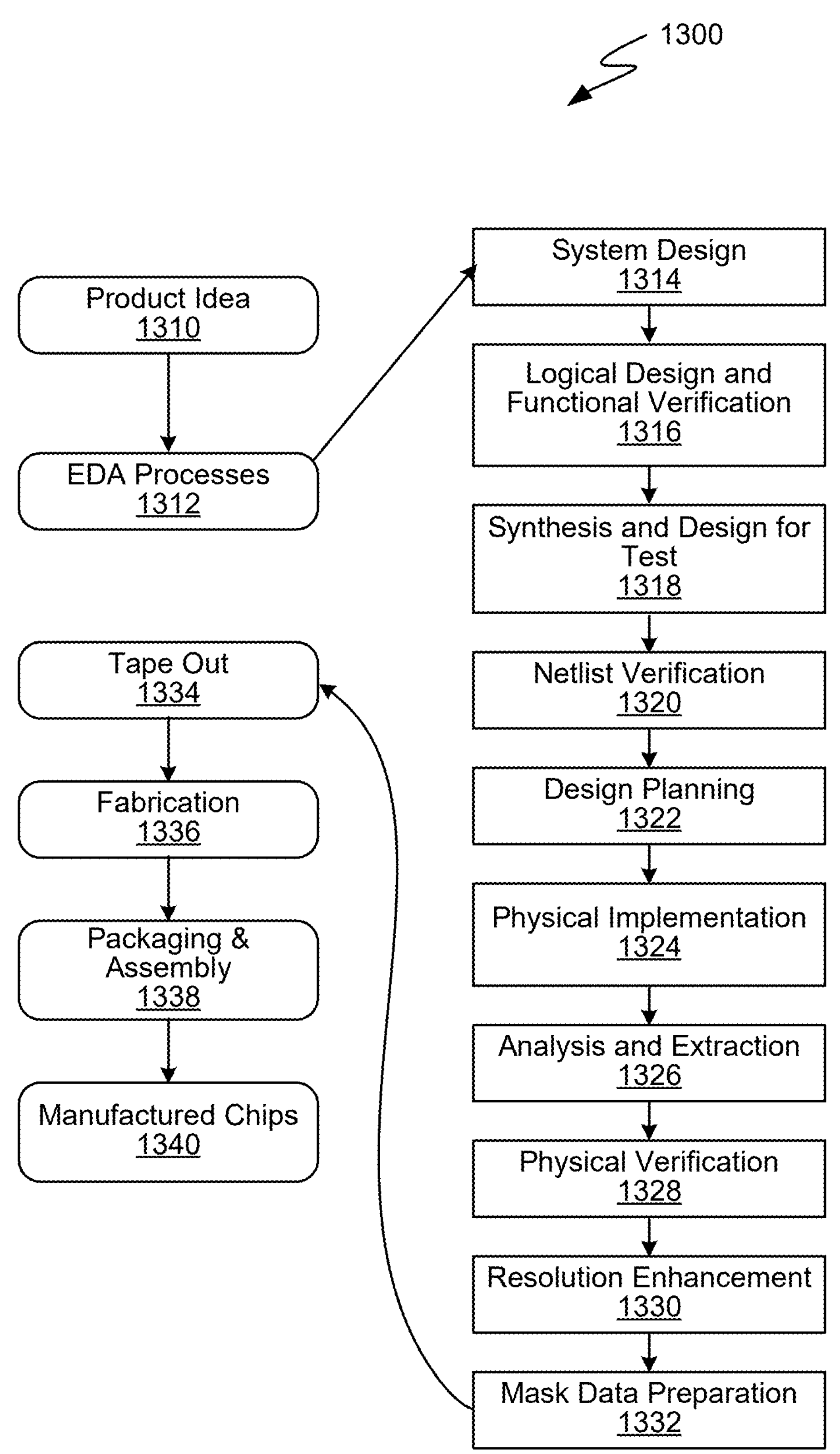
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1310 with information supplied by a designer, information which is transformed to create an article of manufacture that uses a set of EDA processes 1312. When the design is finalized, the design is taped-out 1334, which is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1336 are performed to produce the finished integrated circuit 1340.

Specifications for a circuit or electronic structure may range from low-level transistor material layouts to high-level description languages. A high-level description may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 13. The processes described by be enabled by EDA products (or tools).

During system design 1314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1320, the netlist is checked for compliance with timing constraints and for correspondence with the HDL code. During design planning 1322, an overall floor plan for the integrated circuit is constructed and analyzed for timing and top-level routing.

During layout or physical implementation 1324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1326, the circuit function is verified at the layout level, which permits refinement of the layout design. During physical verification 1328, the layout design is checked to ensure that manufacturing constraints are correct, such as DRC constraints, electrical constraints, lithographic constraints, and that circuitry function matches the HDL design specification. During resolution enhancement 1330, the geometry of the layout is transformed to improve how the circuit design is manufactured.

During tape-out, data is created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1400 of FIG. 14) may be used to store the programs and data structures that are used by some or all of the EDA products described herein, and products used for development of cells for the library and for physical and logical design that use the library.

Figure 14:
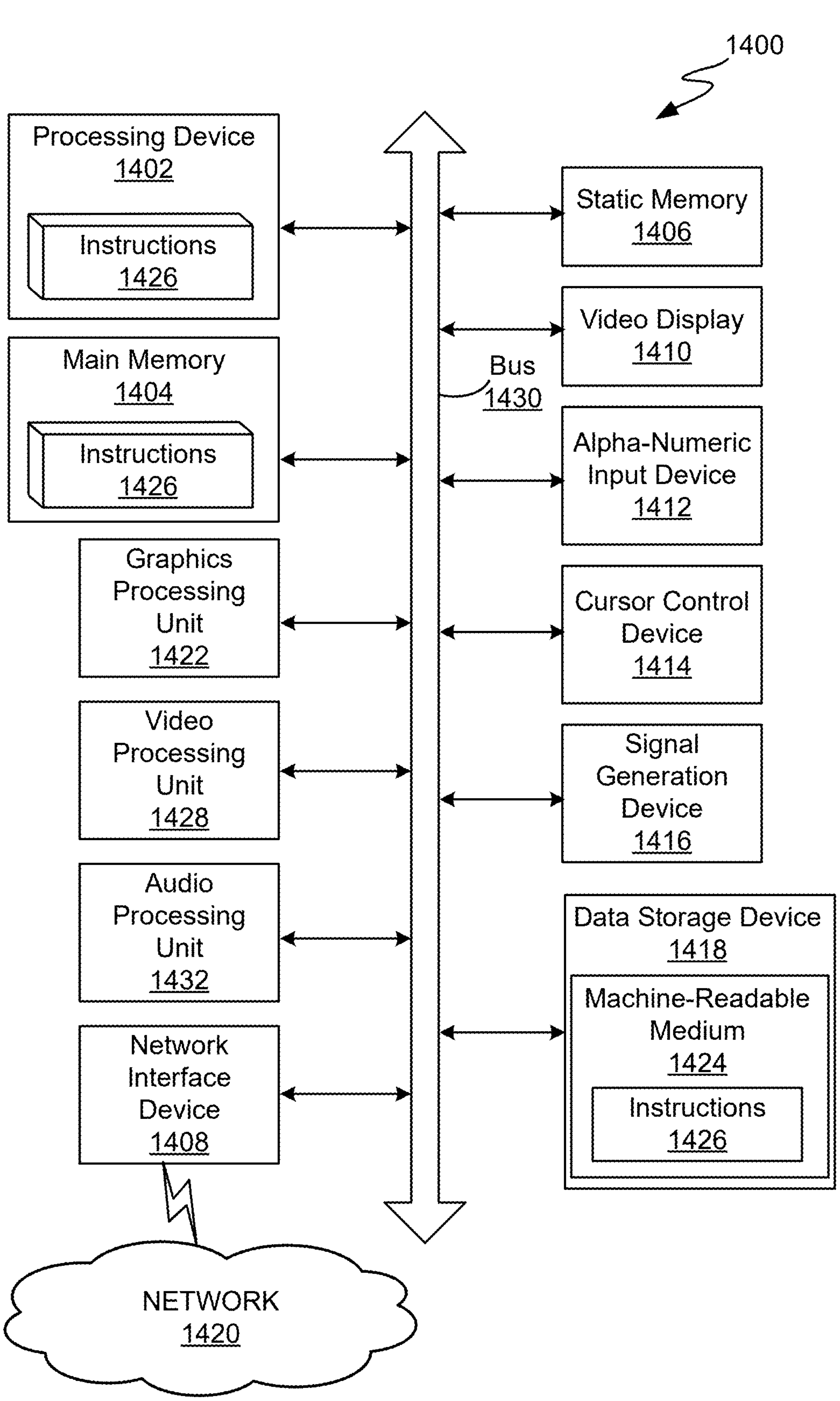
FIG. 14 depicts an example diagram of an example computer system in which embodiments of the present disclosure may operate.

FIG. 14 illustrates an example machine of a computer system 1400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM), a static memory 1406 (e.g., flash memory, static random access memory (SRAM), etc.), and a data storage device 1418, which communicate with each other via a bus 1430.

Processing device 1402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. The processing device 1402 may be configured to execute instructions 1426 for performing the operations and steps described herein.

The computer system 1400 may further include a network interface device 1408 to communicate over the network 1420. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), a graphics processing unit 1422, a signal generation device 1416 (e.g., a speaker), graphics processing unit 1422, video processing unit 1428, and audio processing unit 1432.

The data storage device 1418 may include a machine-readable storage medium 1424 (also known as a non-transitory computer-readable medium) on which is stored one or more sets of instructions 1426 or software embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting machine-readable storage media.

In some implementations, the instructions 1426 include instructions to implement functionality corresponding to the present disclosure. While the machine-readable storage medium 1424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed:

1. A static random access memory (SRAM) cell comprising:

a first PMOS transistor having a source terminal coupled to a supply voltage and a gate terminal coupled to a first node;

a first NMOS transistor having a source terminal receiving a ground voltage, a gate terminal coupled to the first node, and a drain terminal coupled to the drain terminal of the first PMOS transistor;

a second PMOS transistor having a source terminal coupled to the supply voltage and a gate terminal coupled to a second node;

a second NMOS transistor having a source terminal receiving the ground voltage, a gate terminal coupled to the second node, and a drain terminal coupled to the drain terminal of the second PMOS transistor and the first node, wherein the drain terminals of the first PMOS and first NMOS transistors are coupled to the second node;

a third NMOS transistor having a source/drain terminal coupled to the second node, a drain/source terminal coupled to a first bitline, and a gate terminal coupled to a third node;

a fourth NMOS transistor having a source/drain terminal coupled to the first node, a drain/source terminal coupled to a second bitline, and a gate terminal coupled to a fourth node;

a third PMOS transistor having a drain/source terminal coupled to the first node, a source/drain terminal coupled to the second bitline, and a gate terminal coupled to a fifth node; and a fourth PMOS transistor having a drain/source terminal coupled to the second node, a source/drain terminal coupled to the first bitline, and a gate terminal coupled to a sixth node, wherein the third node, the fourth node, the fifth node and the sixth node are different nodes.

2. The SRAM cell of claim 1, wherein to perform a write operation, during a first time period, the third PMOS transistor and the third NMOS transistor are turned on, and the fourth PMOS transistor and the fourth NMOS transistor are turned off.

3. The SRAM cell of claim 2, wherein to perform the write operation, during a second time period, the fourth PMOS transistor and the fourth NMOS transistor are turned on, and the third PMOS transistors and the third NMOS transistor are turned off.

4. The SRAM cell of claim 3, wherein to perform a read operation, during a third time period, the third PMOS transistor and the third NMOS transistor are turned on, and the fourth PMOS transistor and the fourth NMOS transistor are turned off.

5. The SRAM cell of claim 4, wherein to perform the read operation, during a fourth time period, the fourth PMOS transistor and the fourth NMOS transistor are turned on, and the third PMOS transistor and the third NMOS transistor are turned off.

6. The SRAM cell of claim 3, wherein to perform a read operation, during a third time period, the third NMOS transistor and the fourth NMOS transistor are turned on.

7. The SRAM cell of claim 1 further comprising:

a fifth NMOS transistor having a gate terminal coupled to the first node, and a source terminal receiving the ground voltage; and a sixth NMOS transistor having a gate terminal coupled to a seventh node, a source terminal coupled to a drain terminal of the fifth NMOS transistor, and a drain terminal coupled to a third bitline.

8. The SRAM cell of claim 7, wherein during a write operation the first bitline is coupled to the second node and the second bitline is coupled to the first node, and during a read operation the first node is coupled to the third bitline.

9. A system comprising:

a memory storing instructions; and a processor, coupled with the memory and configured to execute the instructions, the instructions when executed causing the processor to:

generate data representative of a first PMOS transistor having a source terminal coupled to a supply voltage and a gate terminal coupled to a first node;

generate data representative of a first NMOS transistor having a source terminal receiving a ground voltage, a gate terminal coupled to the first node, and a drain terminal coupled to the drain terminal of the first PMOS transistor;

generate data representative of a second PMOS transistor having a source terminal coupled to the supply voltage and a gate terminal coupled to a second node;

generate data representative of a second NMOS transistor having a source terminal receiving the ground voltage, a gate terminal coupled to the second node, and a drain terminal coupled to the drain terminal of the second PMOS transistor and the first node, wherein the drain terminals of the first PMOS and first NMOS transistors are coupled to the second node;

generate data representative of a third NMOS transistor having a source/drain terminal coupled to the second node, a drain/source terminal coupled to a first bitline, and a gate terminal coupled to a third node;

generate data representative of a fourth NMOS transistor having a source/drain terminal coupled to the first node, a drain/source terminal coupled to a second bitline, and a gate terminal coupled to a fourth node;

generate data representative of a third PMOS transistor having a drain/source terminal coupled to the first node, a source/drain terminal coupled to the second bitline, and a gate terminal coupled to a fifth node; and generate data representative of a fourth PMOS transistor having a drain/source terminal coupled to the second node, a source/drain terminal coupled to the first bitline, and a gate terminal coupled to a sixth node, wherein the third node, the fourth node, the fifth node and the sixth node are different nodes.

10. The system of claim 9, wherein to perform a write operation, during a first time period, the third PMOS transistor and the third NMOS transistor are turned on, and the fourth PMOS transistor and the fourth NMOS transistor are turned off.

11. The system of claim 10, wherein to perform the write operation, during a second time period, the fourth PMOS transistor and the fourth NMOS transistor are turned on, and the third PMOS transistor and the third NMOS transistor are turned off.

12. The system of claim 11, wherein to perform a read operation, during a third time period, the third PMOS transistor and the third NMOS transistor are turned on, and the fourth PMOS transistor and the fourth NMOS transistor are turned off.

13. The system of claim 12, wherein to perform the read operation, during a fourth time period, the fourth PMOS transistor and the fourth NMOS transistor are turned on, and the third PMOS transistor and the third NMOS transistor are turned off.

14. The system of claim 9, wherein the instructions further cause the processor to:

generate data representative of a fifth NMOS transistor having a gate terminal coupled to the first node, and a source terminal receiving the ground voltage; and generate data representative of a sixth NMOS transistor having a gate terminal coupled to a seventh node, a source terminal coupled to a drain terminal of the fifth NMOS transistor, and a drain terminal coupled to a third bitline.

15. A non-transitory computer readable medium comprising stored instructions, which when executed by a processor, cause the processor to:

generate data representative of a first PMOS transistor having a source terminal coupled to a supply voltage and a gate terminal coupled to a first node;

generate data representative of a first NMOS transistor having a source terminal receiving a ground voltage, a gate terminal coupled to the first node, and a drain terminal coupled to the drain terminal of the first PMOS transistor;

generate data representative of a second PMOS transistor having a source terminal coupled to the supply voltage and a gate terminal coupled to a second node;

generate data representative of a second NMOS transistor having a source terminal receiving the ground voltage, a gate terminal coupled to the second node, and a drain terminal coupled to the drain terminal of the second PMOS transistor and the first node, wherein the drain terminals of the first PMOS and first NMOS transistors are coupled to the second node;

generate data representative of a third NMOS transistor having a source/drain terminal coupled to the second node, a drain/source terminal coupled to a first bitline, and a gate terminal coupled to a third node;

generate data representative of a fourth NMOS transistor having a source/drain terminal coupled to the first node, a drain/source terminal coupled to a second bitline, and a gate terminal coupled to a fourth node;

generate data representative of a third PMOS transistor having a drain/source terminal coupled to the first node, a source/drain terminal coupled to the second bitline, and a gate terminal coupled to a fifth node; and generate data representative of a fourth PMOS transistor having a drain/source terminal coupled to the second node, a source/drain terminal coupled to the first bitline, and a gate terminal coupled to a sixth node, wherein the third node, the fourth node, the fifth node and the sixth node are different nodes.

16. The non-transitory computer readable medium of claim 15, wherein to perform a write operation, during a first time period, the third PMOS transistor and the third NMOS transistor are turned on, and the fourth PMOS transistor and the fourth NMOS transistor are turned off.

17. The non-transitory computer readable medium of claim 16, wherein to perform the write operation, during a second time period, the fourth PMOS transistor and the fourth NMOS transistor are turned on, and the third PMOS transistor and the third NMOS transistors are turned off.

18. The non-transitory computer readable medium of claim 17, wherein to perform a read operation, during a third time period, the third PMOS transistor and the third NMOS transistor are turned on, and the fourth PMOS transistor and the fourth NMOS transistor are turned off.

19. The non-transitory computer readable medium of claim 18, wherein to perform the read operation, during a fourth time period, the fourth PMOS transistor and the fourth NMOS transistor are turned on, and the third PMOS transistor and the third NMOS transistor are turned off.

20. The non-transitory computer readable medium of claim 19, wherein the instructions further cause the processor to:

generate data representative of a fifth NMOS transistor having a gate terminal coupled to the first node, and a source terminal receiving the ground voltage; and generate data representative of a sixth NMOS transistor having a gate terminal coupled to a seventh node, a source terminal coupled to a drain terminal of the sixth NMOS transistor, and a drain terminal coupled to a third bitline.

* * * * *